(12) United States Patent
Mynam et al.

(10) Patent No.: US 10,261,567 B2
(45) Date of Patent: Apr. 16, 2019

(54) AUTOMATICALLY CONFIGURABLE INTELLIGENT ELECTRONIC DEVICE

(71) Applicant: Schweitzer Engineering Laboratories, Inc., Pullman, WA (US)

(72) Inventors: Mangapathirao Venkata Mynam, Pullman, WA (US); Armando Guzman-Casillas, Pullman, WA (US)

(73) Assignee: SCHWEITZER ENGINEERING LABORATORIES, INC., Pullman, WA (US)

( * ) Notice: Subject to any disclaimer, the term of this patent is extended or adjusted under 35 U.S.C. 154(b) by 330 days.

(21) Appl. No.: 14/278,195

(22) Filed: May 15, 2014

(65) Prior Publication Data

US 2014/0351572 A1 Nov. 27, 2014

Related U.S. Application Data

(60) Provisional application No. 61/825,953, filed on May 21, 2013.

(51) Int. Cl.
*G06F 1/32* (2006.01)
*G06F 9/445* (2018.01)
(Continued)

(52) U.S. Cl.
CPC .......... *G06F 1/3234* (2013.01); *H02H 3/006* (2013.01); *G01R 31/08* (2013.01);
(Continued)

(58) Field of Classification Search
None
See application file for complete search history.

(56) References Cited

U.S. PATENT DOCUMENTS 3,946,281 A 3/1976 Llona
4,769,735 A 9/1988 Ueda
(Continued)

FOREIGN PATENT DOCUMENTS

WO 9900951 1/1999
WO 0011840 3/2000
(Continued)

OTHER PUBLICATIONS

Das, J. C. Power System Analysis Short-Circuit Load Flow and Harmonics. N.Y., Marcel Dekker, 2002. Chapter 1. eBook.*

(Continued)

*Primary Examiner* — Kim Huynh
*Assistant Examiner* — Kevin M Stewart
(74) *Attorney, Agent, or Firm* — Richard M. Edge; Jared L. Cherry

(57) ABSTRACT

Disclosed herein are intelligent electronic devices configured for monitoring an electric power delivery system and for determining a plurality of configuration settings based on measurements from the electric power delivery system. An IED may identify a configuration event, obtain a plurality of electrical parameters associated with the configuration event, determine a plurality of configuration parameters from the electrical parameters, determine a plurality of configuration settings based on the configuration parameters, and apply the settings to the IED. The IED may also be configured to initiate the configuration event by opening a single pole of a multi-phase power line.

18 Claims, 7 Drawing Sheets

(51) Int. Cl.
  *H02H 3/00* (2006.01)
  *H02J 3/00* (2006.01)
  *G01R 31/08* (2006.01)
  *H02H 1/00* (2006.01)
(52) U.S. Cl.
  CPC ....... *G06F 9/44505* (2013.01); *H02H 1/0061* (2013.01); *H02J 3/00* (2013.01); *Y02D 10/43* (2018.01)

(56) References Cited

U.S. PATENT DOCUMENTS

| | | |
|---|---|---|
| 5,224,011 A | 6/1993 | Yalla |
| 5,455,776 A | 10/1995 | Novosel |
| 5,592,393 A | 1/1997 | Yalla |
| 5,627,716 A | 5/1997 | Lagree |
| 5,654,967 A | 8/1997 | Okuyama |
| 5,694,281 A | 12/1997 | Roberts |
| 5,751,532 A | 5/1998 | Kanuchok |
| 5,856,903 A | 1/1999 | Smith |
| 5,872,722 A | 2/1999 | Oravetz |
| 5,978,784 A | 11/1999 | Fagg |
| 5,987,393 A | 11/1999 | Stinson |
| 6,005,757 A | 12/1999 | Shvack |
| 6,055,145 A | 4/2000 | Lagree |
| 6,239,960 B1 | 5/2001 | Martin |
| 6,330,141 B1 | 12/2001 | Elms |
| 6,377,283 B1 | 4/2002 | Thomas |
| 6,426,951 B1 | 7/2002 | Antonsson |
| 6,496,862 B1 | 12/2002 | Akatsu |
| 6,618,455 B1 | 9/2003 | Maeda |
| 6,753,772 B2 | 6/2004 | Winkler |
| 6,795,789 B2 | 9/2004 | Vandiver |
| 6,970,771 B1 | 11/2005 | Preiss |
| 6,973,589 B2 | 12/2005 | Wright |
| 7,552,446 B1 | 6/2009 | Sosnovsky |
| 7,570,469 B2 | 8/2009 | Guzman-Casillas |
| 8,739,178 B2 | 5/2014 | Bosold |
| 2002/0054096 A1 | 5/2002 | Thomas |
| 2002/0144038 A1 | 10/2002 | Smith |
| 2002/0173927 A1 | 11/2002 | Vandiver |
| 2003/0151867 A1* | 8/2003 | Kase .................. H02H 3/081 361/77 |
| 2004/0044991 A1 | 3/2004 | Eschermann |
| 2004/0138787 A1 | 7/2004 | Ransom |
| 2004/0240470 A1 | 12/2004 | Medved |
| 2005/0058149 A1 | 5/2005 | Howe |
| 2005/0097373 A1 | 5/2005 | Stoupis |
| 2006/0085103 A1 | 4/2006 | Smith |
| 2006/0095716 A1 | 5/2006 | Ramesh |
| 2006/0116794 A1 | 6/2006 | Stoupis |
| 2006/0230394 A1 | 10/2006 | Forth |
| 2007/0033590 A1 | 2/2007 | Masuouka |
| 2007/0270114 A1 | 11/2007 | Kessler |
| 2008/0284585 A1 | 11/2008 | Schweitzer, III |
| 2010/0013498 A1* | 1/2010 | Olguin .................. G01R 27/16 324/649 |
| 2010/0013632 A1* | 1/2010 | Salewske ........... G01R 19/2513 340/540 |
| 2010/0053828 A1* | 3/2010 | Selejan .................... H02H 3/34 361/76 |
| 2010/0204933 A1* | 8/2010 | Lagree .................... H02H 7/30 702/58 |
| 2011/0084672 A1* | 4/2011 | Labuschagne ........ H02J 3/1878 323/255 |
| 2011/0188159 A1 | 8/2011 | Su |
| 2011/0264389 A1* | 10/2011 | Mynam ................ G01R 31/086 702/58 |
| 2011/0282507 A1* | 11/2011 | Oudalov .................. H04B 3/54 700/292 |
| 2012/0053744 A1* | 3/2012 | Manson .................... H02J 3/14 700/293 |
| 2012/0068717 A1* | 3/2012 | Gong .................. G01R 31/085 324/522 |
| 2013/0035882 A1 | 2/2013 | Wahlroos |

FOREIGN PATENT DOCUMENTS

| | | |
|---|---|---|
| WO | 0188664 | 11/2001 |
| WO | 2006017944 | 2/2006 |

OTHER PUBLICATIONS

R.E. Fehr, Sequence Impedances of Transmission Lines, May 2004, http://helios.acomp.usf.edu/~fehr/carson.pdf.*

PCT/US2014/038409 Patent Cooperation Treaty, International Search Report and Written Opinion of the International Searching Authority, dated Oct. 1, 2014.

Glassburn and Sonnemann, Principles of Induction-Type Relay Design, AIEE Transactions, vol. 72, Part III, 1953 (Paper 53-74). New York, New York.

Adkins, Co-ordination of Fuse Links, Electrical World, Mar. 13, 1937, Jersey Central Power & Light Company, Asbury Park , New Jersey.

Sonnemann, A New Inverse Time Overcurrent Relay with Adjustable Characteristics, AIEE Transactions, Jan. 1953 (Paper 53-74), New York, New York.

Schweitzer and Aliaga, Digital Programmable Time-Parameter Relay Offers Versatility and Accuracy, IEEE Transactions on Power Apparatus, IEEE Transactions on Power Apparatus and Systems, vol. PAS-99, No. 1, Vancouver, British Columbia, Canada 1980.

Basler Electric, BEI Numerical Systems Time Current Characteristic Curves and Time Dial Calculater, Basler Electric Company, Highland, Illinois. Jun. 2002.

Jampala, Venkata and Damborg, Adaptive Transmission Protection: Concepts and Computational Issues, IEEE Transaction on Power Delivery, vol. 4., No. 1, Jan. 1989, Portland, Oregon.

Sachdev, Chattopadhyah and Sidhu, An Adaptive Relaying Approach to Distribution System Protection, Power System Research Group, University of Saskatchewan, Saskatoon, S.K., Canada, Oct. 19, 1992.

Rockefeller, Wagner and Linders, Adaptive Transmission Relaying Concepts for Improved Performance, IEEE Transactions on Power Delivery, vol. 3, No. 4, Oct. 1988, San Francisco, California.

Horowitz, Phadke and Thorp, Adaptive Transmission System Relaying, IEEE Transactions on Power Delivery, vol. 3, No. 4, Oct. 1988, San Francisco, California.

Thorp, Horowitz and Phadke, The Application of an Adaptive Technology to Power System Protection and Control, Cornell University, Ithaca, New York, 1988.

PCT/US2006/024657 Patent Cooperation Treaty, International Search Report and Written Opinion of the International Searching Authority, dated Feb. 20, 2007.

T.S. Sidhu, Pradeep K Gangadharan, Control and Automation of Power System Substation using IEC61850 Communication, Proceedings of the 2005 IEEE Conference on Control Applications, Toronto, Canada, Aug. 28-31, 2005.

Mark Adamiak, Drew Baigent, and Scott Evans, Practical Considerations in Application of UCA GOOSE, Presented at: Georgia Tech Relay, May 3-5, 2000.

Technical Report—IEC TR 61850-1, International Electrotechnical Commission, Apr. 28, 2003.

Ethernet & IEC 61850: Start Up Manual, Siemans, Dec. 5, 2005.

IEEE Standard for Synchrophasors for Power Systems, IEEE Std C37 118, Mar. 22, 2008.

Gustavo Brunello and Bogdan Kasztenny, New Communications Protocols An Application of a Protection Relaying Scheme using the UCA/MMS Standard, Mar. 2002.

Douglas Proudfoot, UCA and 61850 for Dummies, Mar. 21, 2002.

PCT/US2007/074078 Patent Cooperation Treaty, International Search Report and Written Opinion of the International Searching Authority, dated Sep. 16, 2008.

Mackiewicz, R.E., Overview of IEC 61850 and Benefits, Transmission and Distribution Conference and Exhibition, IEEE, May 21-24, 2006.

* cited by examiner

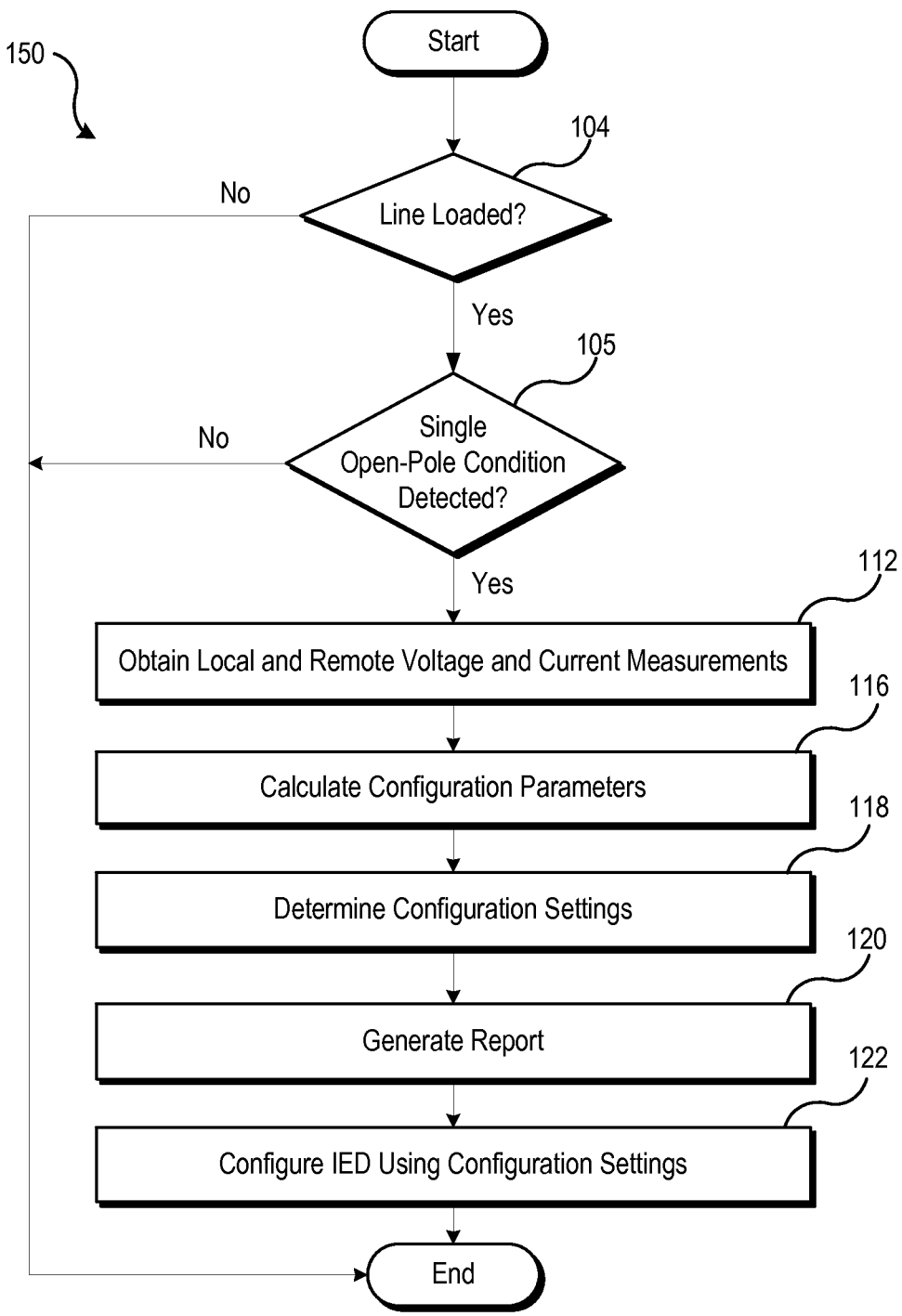

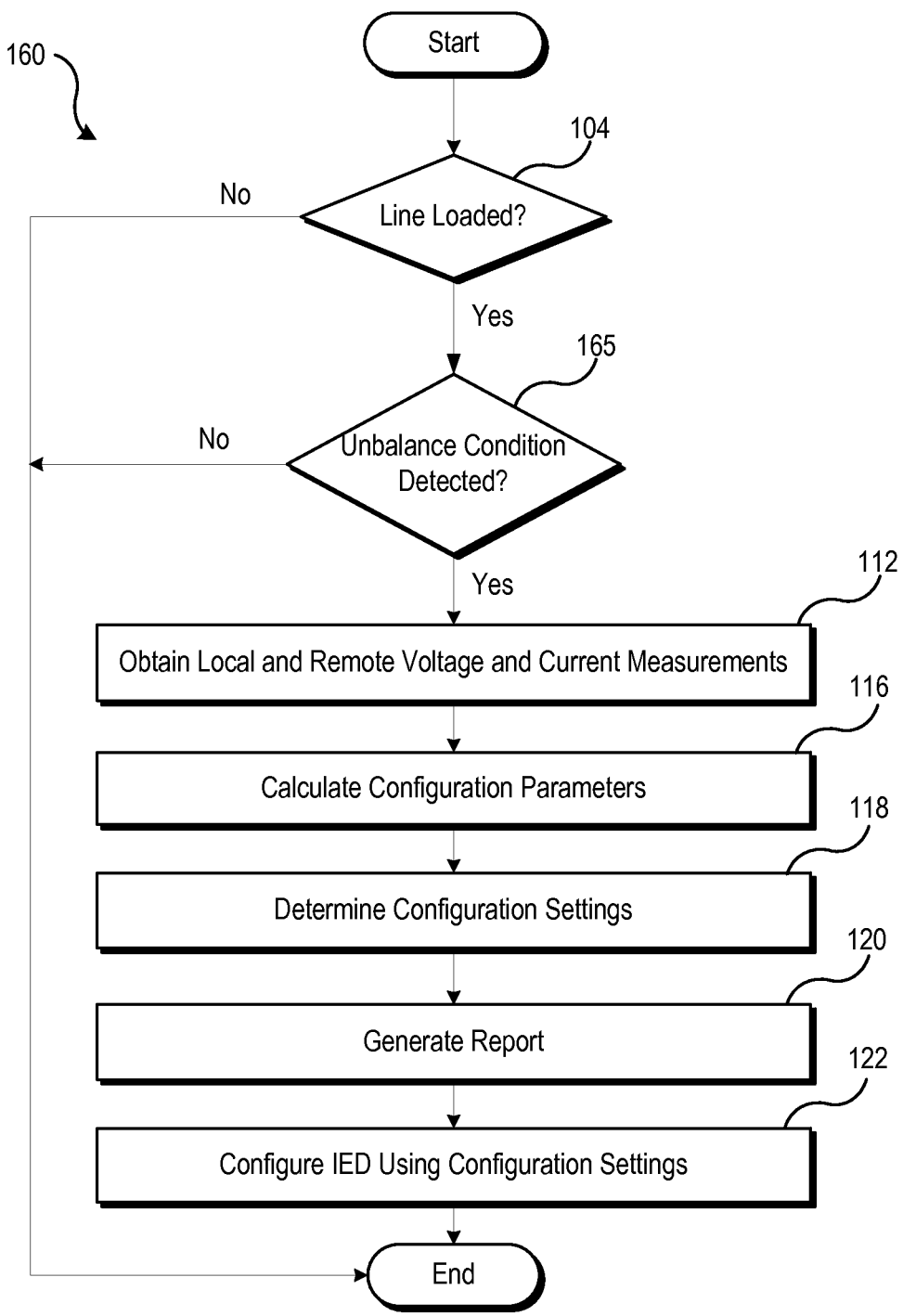

AUTOMATICALLY CONFIGURABLE INTELLIGENT ELECTRONIC DEVICE

RELATED APPLICATIONS

This application claims the benefit under 35 U.S.C. § 119(e) of U.S. Provisional Application No. 61/825,953, filed on 21 May 2013, naming Mangapathirao Venkata Mynam, and Armando Guzman-Casillas as inventors, and titled "Automatically Configurable Intelligent Electronic Device" which is hereby incorporated by reference herein in its entirety.

TECHNICAL FIELD

This disclosure relates to an automatically configurable intelligent electronic device (IED). More particularly, this disclosure relates to an automatically configurable IED for protecting an electrical power line in an electric power transmission or distribution system (delivery system).

BRIEF DESCRIPTION OF THE DRAWINGS

Non-limiting and non-exhaustive embodiments of the disclosure are described, including various embodiments of the disclosure with reference to the figures, in which:

FIG. 1B illustrates a flowchart of a method for automatically configuring an IED for protecting an electrical power line in an electric power delivery system in connection with an unplanned configuration event consistent with the present disclosure.

FIG. 1C illustrates a flowchart of a method for automatically configuring an IED for protecting an electrical power line in an electric power delivery system in connection with an unbalance condition consistent with the present disclosure.

DETAILED DESCRIPTION

Figure 1A:
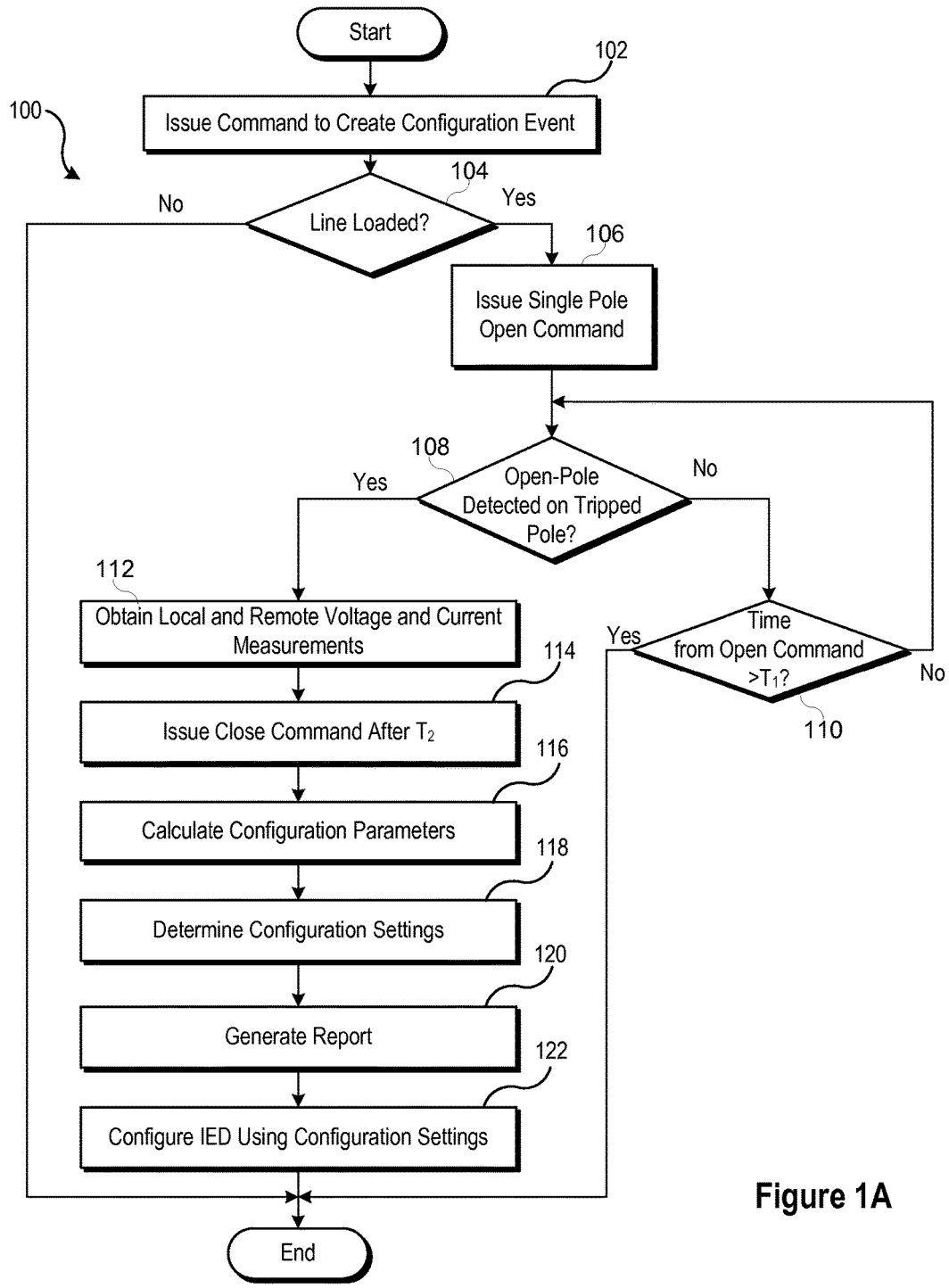
FIG. 1A illustrates a flowchart of a method for automatically configuring an intelligent electronic device (IED) for protecting an electrical power line in an electric power delivery system in connection with a user initiated configuration event consistent with the present disclosure.

The present disclosure describes a variety of systems and methods for automatically configuring a protective relay associated with an electrical power line. According to various embodiments, configuration parameters may be determined during configuration events. A configuration event may include single pole open condition at one terminal or a specifically designated test command, according to various embodiments. Configuration parameters, according to various embodiments, may include a positive sequence line impedance value and a zero sequence line impedance value.

Based on the configuration parameters, automatically determined relay settings may be used to configure a protective relay. The relay settings may be determined based upon the configuration parameters, and may include settings such as distance and directional element settings. Certain embodiments may allow a user to automatically or manually configure an intelligent electronic device (IED) based on the configuration parameters. In some embodiments, the automatically determined relay settings may be provided to the user in the event that the user elects to manually configure the IED. The user may therefore be able to compare the automatically determined relay settings with the manually configured relay settings.

According to some embodiments, the IED may generate a report showing automatically determined relay settings and other related information. For example, alternative or in addition to the automatically determined relay settings, the report may include measurements associated with the settings, a distance element(s), a directional element(s) and/or permissive trip scheme settings.

Certain embodiments consistent with the present disclosure may include IEDs installed at terminals of a power line that exchange time-synchronized current and voltage measurements. Voltage measurements may be acquired using line side potential transformers. Current measurements may be acquired using current transformers. Further, breakers may be configured to perform single-phase pole opening and closing based upon control actions generated by the IEDs.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device over a system data bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic and/or processor executable instructions.

FIG. 1A illustrates a flowchart of a method 100 for automatically configuring an IED for protecting an electrical power line in an electric power delivery system consistent with the present disclosure. An electric power delivery system may include electric power generation, distribution, transmission, consumption, or the like, with associated electric power generation, distribution, and/or transmission systems. According to the illustrated embodiment, method 100 begins at 102 by issuing a command to create a configuration event. As discussed below, in certain embodiments, the configuration event may be unplanned. In other words, a method may await the occurrence of a configuration event, and upon the occurrence of such an event, elements 112 and 116-122 of method 100 may be performed.

At 104, method 100 may determine whether an electrical transmission line associated with the configuration event is loaded (i.e., whether current of a sufficient magnitude is flowing through the line or voltage angle between the two terminals is greater than a threshold). If the line is not loaded, method 100 may terminate. As used herein, an electrical power line may refer to a plurality of power lines, each of which is configured to transmit power on one phase in a multi-phase electrical distribution system. If the electrical power line is loaded, a command may be generated at 106 to open a single pole of the power line. According to some embodiments, the command issued at 106 may comprise an instruction to a breaker or a recloser to open.

At 108, method 100 may determine whether an open-pole condition is detected on the phase commanded to open. If the open-pole condition is not detected, at 110, method 100 may determine whether a time period from the open command is greater than a predetermined period of time (e.g., $T_1$). If the time period exceeds $T_1$, method 100 may terminate. If the period time does not exceed $T_1$, method 100 may return to 108.

During the single pole open condition, a plurality of local and remote voltage and current measurements may be obtained, at 112. According to various embodiments, an IED implementing method 100 may receive voltage and current measurements via a data network. The algorithm may utilize voltage and current measurements from local and/or remote terminals. According to some embodiments, an IED implementing method 100 may comprise a sensor component that permits the IED to measure electrical parameters (e.g., voltages and/or currents), and thus may allow the IED to obtain local measurements that may be used in connection with method 100. After the data values are collected, at 114, a command may be issued to close the pole that was opened at 106. According to the illustrated embodiment, the command to close the pole may be issued after a predetermined time period $T_2$.

At 116, method 100 may calculate a plurality of configuration parameters. According to one embodiment, the configuration parameters may include a positive sequence line impedance value of the electrical power line and a zero sequence line impedance value of the electrical power line. The positive sequence line impedance and the negative sequence line impedance may be set to the same value. The positive line impedance value may be calculated using Equation 1.

$$\frac{V2x^2 - V2y^2}{I2x * V2y - I2y * V2x} \qquad \text{Eq. 1}$$

where:
 V2x is a negative sequence voltage at a local terminal, as shown in FIG. 3B;
 V2y is a negative sequence voltage at a remote terminal;
 I2x is a negative sequence current calculated at the local terminal; and
 I2y is a negative sequence current calculated at the remote terminal.

The zero sequence line impedance value may be calculated using Equation 2.

$$\frac{V0x^2 - V0y^2}{I0x * V0y - I0y * V0x} \qquad \text{Eq. 2}$$

where:
 V0x is a zero sequence voltage calculated at the local terminal, as shown in FIG. 3B;
 V0y is a zero sequence voltage calculated at the remote terminal;
 I0x is a zero sequence current calculated at the local terminal; and
 I0y is a zero sequence current calculated at the remote terminal.

For the single-pole open method, Equation 3 may be used to calculate positive-, and negative-sequence impedance values:

$$Z1L = \frac{(V2y - V2x)}{I2y} = Z2L \qquad \text{Eq. 3}$$

where:

Z1L is a positive sequence line impedance;
Z2L is a negative sequence line impedance;
V2y is a negative sequence voltage calculated at the remote terminal;
V2x is a negative sequence voltage calculated at the local terminal; and,
I2y is a negative sequence current calculated at the remote terminal.

The zero sequence line impedance value may be calculated using Equation 4.

$$Z0L = \frac{(V0y - V0x)}{I0y} \qquad \text{Eq. 4}$$

where:

Z0L is a zero sequence line impedance;
V0y is a zero sequence voltage calculated at the remote terminal;
V0x is a zero sequence voltage calculated at the local terminal; and,
I0y is a zero sequence current calculated at the remote terminal.

According to certain embodiments including shunt reactors at the terminals, Equation 1 and Equation 2 may be compensated to remove the current through the line reactor. This can be done using the voltage measurement at the terminal and the impedance of the shunt reactor. More specifically, the term I2x in Equation 1 may be replaced by I2xc, which determined using Equation 5.

$$I2xc = I2x - \frac{V2x}{\text{Reactor Impedance}} \qquad \text{Eq. 5}$$

At 118, configuration settings may be determined. According to various embodiments, the configuration settings may include settings for a distance element and/or a directional element. The distance elements, according to some embodiments, may comprise a plurality of zone reach settings.

At 120, a report may be generated that includes the configuration parameters and/or the configuration settings. According to some embodiments, a report may be automatically generated, such that a report is created upon the occurrence of a configuration event.

At 122, the IED may be configured using the configuration settings. The configuration settings may, according to some embodiments, comprise settings for one or more distance elements and one or more directional elements. The distance elements, according to some embodiments, may comprise a plurality of zone reach settings. After configuring the IED, the method 100 may terminate.

According to one embodiment, the IED may be configured to calculate the configuration settings, and wait for user input before applying the calculated configuration settings. According to this embodiment, once the IED calculates the configuration settings, the IED may send a report to a user detailing the calculated configuration settings and the previous configuration settings (if available). The IED may then wait for an approval by a user before applying the calculated configuration settings. The user may approve the calculated configuration settings using a human-machine interface such as the front panel of the relay, using setting software, using a remote log in, or the like. According to another embodiment, the IED may apply the calculated configuration settings and send a report including the calculated configuration settings and the previous configuration settings (if available) to a user. Such reports may be sent via a communications network, email, displayed on a human-machine interface, or the like.

FIG. 1B illustrates a flowchart of a method 150 for automatically configuring an IED for protecting an electrical power line in an electric power delivery system in connection with an unplanned configuration event consistent with the present disclosure. As illustrated, the elements of method 150 primarily include a subset of the elements described in connection with method 100, as illustrated in FIG. 1A. Although many elements are the same, element 105 is unique to method 150. At 105, method 150 may determine whether a single open-pole condition is detected. The condition may be detected using a variety of methods. For example, in one embodiment, a single open-pole condition is detected at the local terminal where a voltage measurement exceeds a threshold and a single pole open condition exists at the local terminal. In another embodiment, a single open-pole condition may be detected based upon a signal from a remote terminal indicating a three pole closed condition and a single pole open condition at the local terminal. As described below in connection with FIG. 2, a single open-phase condition may occur in connection with reclose operations. A reclose operation may occur, for example, after a fault. If the single open pole condition is not detected, the method may end. If the single open pole condition is detected, the method may continue to step 112 as described above.

FIG. 1C illustrates a flowchart of a method 160 for automatically configuring an IED for protecting an electrical power line in an electric power delivery system in connection with an unplanned configuration event consistent with the present disclosure. As illustrated, the elements of method 160 primarily include a set of elements similar to those described in connection with method 150, as illustrated in FIG. 1B. Although many elements are the same, element 165 is unique to method 160. At 165, method 160 may determine whether an unbalance condition is detected. An unbalance condition may be any that results in levels of negative sequence current and/or voltage above nominal levels of such. For example, an open pole condition, such as that detected in conjunction with method 150 may result in unbalance. An unbalance condition may result from, for example, an external unbalance condition, a single-phase-to-ground fault, a phase-to-phase fault, a phase-to-phase-to-ground fault, and the like. If the method 160 does not detect an unbalance condition 165, the method may end. Upon detection of the unbalance condition 165, the method 160 may continue to step 112 as described above.

Figure 2:
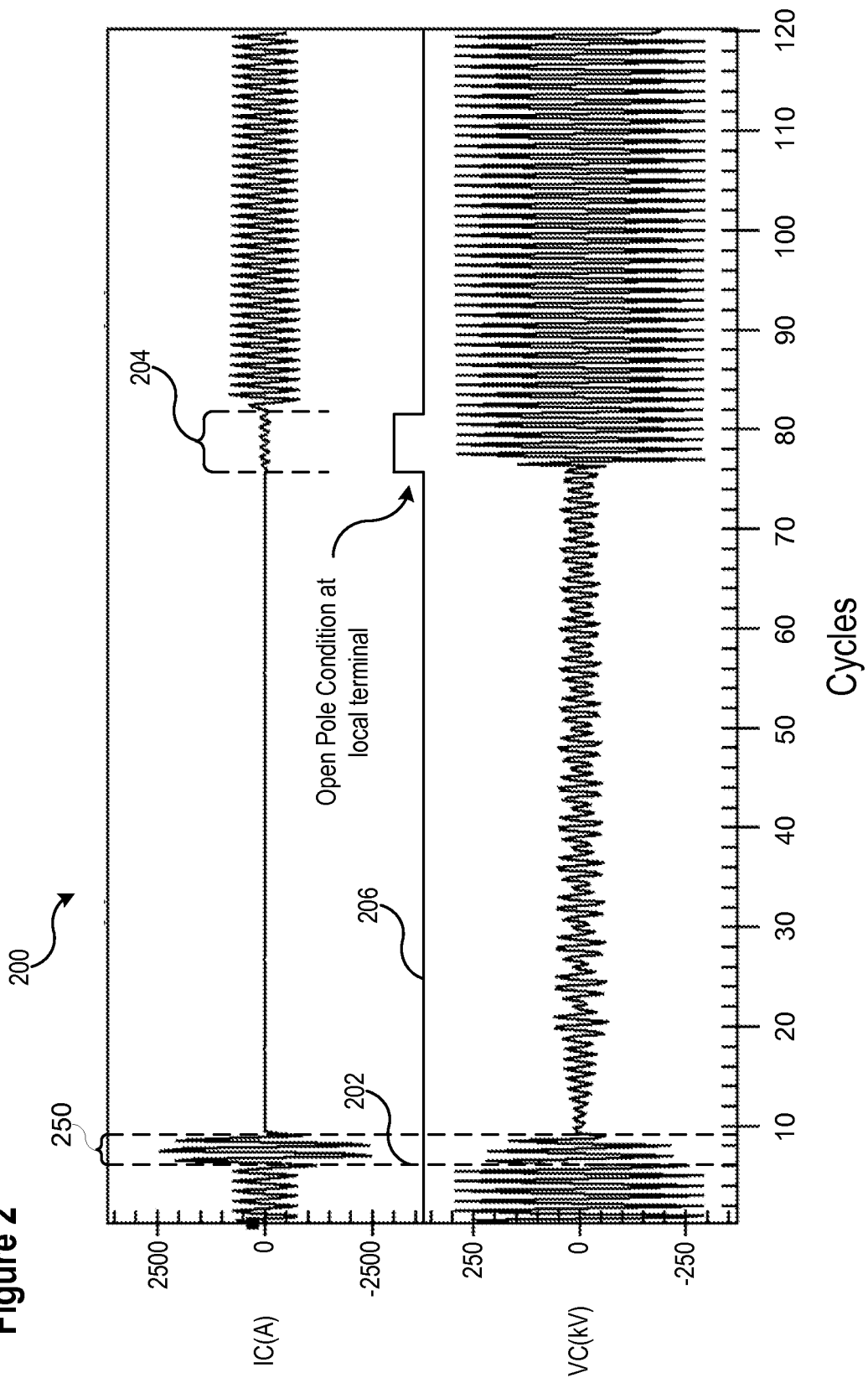
FIG. 2 illustrates a graph over time of current and voltage values of a faulted phase of an electric power distribution system during pre-fault, fault, and post-fault consistent with various embodiments of the present disclosure.

FIG. 2 illustrates a graph 200 over time of current and voltage values of one phase of an electric power distribution system during pre-fault, fault 250, and post-fault consistent with various embodiments of the present disclosure. At time 202, a single phase to ground fault, may occur. In response, IEDs at both terminals of the power line may open breakers and issue a reclose command in a lead-follower fashion. The scenario illustrated in FIG. 2 provides a window of time where one pole at one of the line terminals is open. A scenario, such as that illustrated in FIG. 2, may be referred to as a configuration event because data collected during this period may allow an IED to collect information that may be used to generate configuration settings.

During time period 204, an open pole condition exists at one terminal, as shown by the digital status indicator 206. Data collected during time period 204 may be used to calculate configuration parameters. The data may, according to some embodiments, be collected from a local terminal and a remote terminal. Based upon the data, a plurality of configuration parameters may be determined. In some embodiments, the configuration parameters may include the positive and zero sequence impedance values of the electrical power line. The configuration parameters may be used to determine a plurality of configuration settings, such as distance and directional element settings.

Figure 3A:
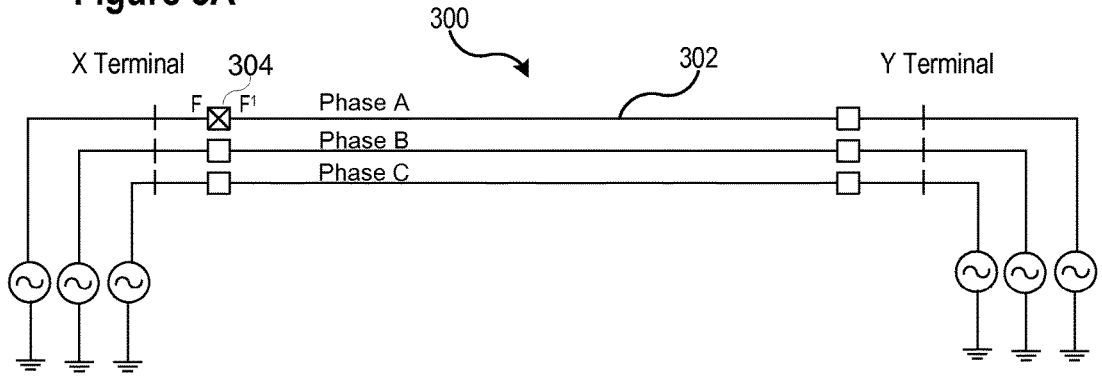
FIG. 3A illustrates a two terminal electric power distribution system with three phases, in which one pole is open at one terminal consistent with various embodiments of the present disclosure.
Figure 3B:
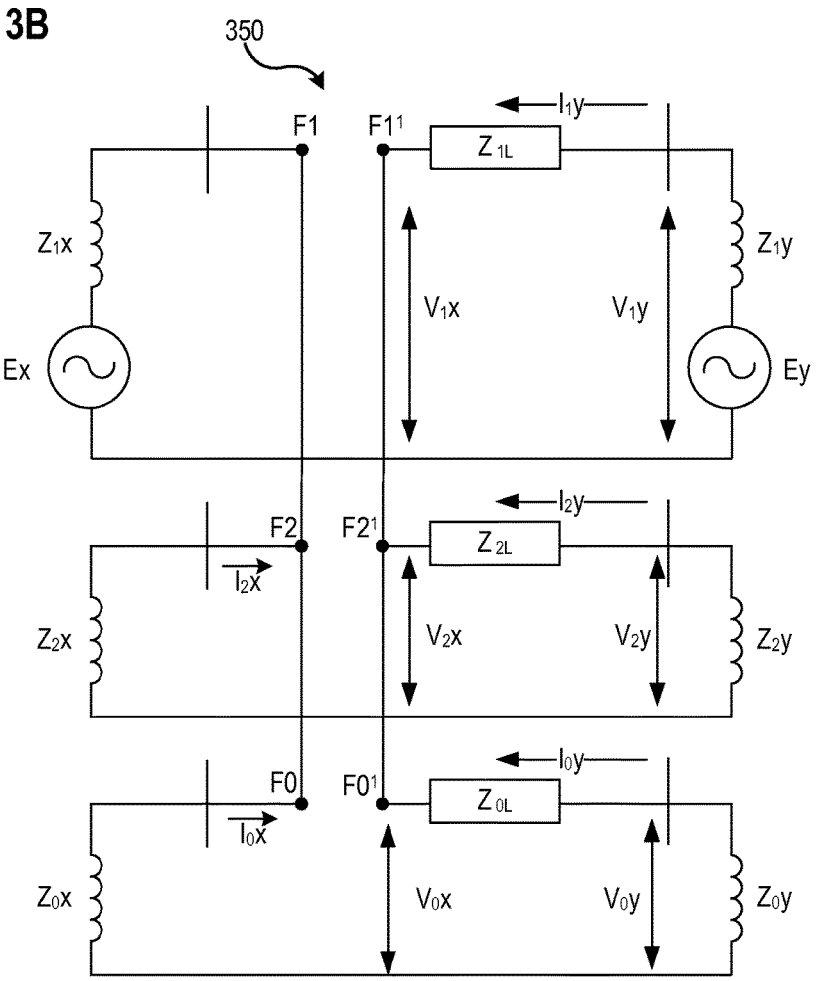
FIG. 3B illustrates a symmetrical component network representation of the electric power distribution system of FIG. 3A.

FIG. 3A illustrates a two terminal electric power distribution system 300 with three phases, in which one pole is open at one terminal consistent with various embodiments of the present disclosure. In delivery systems with single pole breaker capability, having an open pole at one terminal is a feasible system condition during reclose conditions. The open pole on breaker 304 is associated with power line 302.

According to some embodiments, the configuration illustrated in FIG. 3A may be intentionally created to obtain data for use in configuring an IED using the systems and methods disclosed herein. Alternatively, the configuration illustrated in FIG. 3A, may be an unplanned condition that occurs during the operation of the electric power distribution system 300. In the circumstance in which the condition is unplanned, system 300 may be configured to identify the occurrence of such a condition, and upon identification of the condition, to obtain data values that may be used to perform automatic configuration of IEDs using the systems and methods disclosed herein.

FIG. 3B illustrates a symmetrical component network representation 350 of the electric power distribution system 300 of FIG. 3A. Based upon the symmetrical component network representation 350, Equations 1-4, as set forth above, may be used to calculate a negative sequence impedance value and a zero sequence impedance value of the three phase electrical power line, respectively.

According to some embodiments, the negative sequence impedance value and the zero sequence impedance value may be referred to as configuration parameters. An IED may utilize the configuration parameters in order to determine (e.g., automatically determine or calculate) a plurality of configuration settings. According to some embodiments, the configuration settings may also include parameters provided by a user. For example, the user may provide configuration settings including:

a current transformer ratio (CTR);
potential transformer ratio (PTR);
line length (LL); and/or
line length units (LLUNIT).

Additional configuration parameters may be calculated and used in order to determine a plurality of configuration settings. For example, the values Z1MAG, Z1ANG, Z0MAG, and Z0ANG may refer to the calculated positive sequence impedance magnitude, angle and zero sequence impedance magnitude and angle, respectively. These values may be further utilized to calculate secondary impedance magnitude, as provided by Equation 6 and Equation 7.

$$Z1MAG\_sec = \frac{Z1MAG}{\frac{PTR}{CTR}} \quad \text{Eq. 6}$$

$$Z0MAG\_sec = \frac{Z0MAG}{\frac{PTR}{CTR}} \quad \text{Eq. 7}$$

According to some embodiments, the plurality of configuration settings may include various distance settings. The distance settings may include a plurality of zone reach settings. According to one specific embodiment, settings for three zones may be established. In zone 1, an instantaneous tripping element may be set to 80% of Z1MAG_sec, as provided in Equation 8.

$$Z1set = 0.8 * Z1MAG\_sec \quad \text{Eq. 8}$$

Further, in zone 1 the value of k0set may be determined using Equation 9.

$$k0set = \frac{Z0MAG\_sec \times e^{j*Z0ANG} - Z1MAG\_sec \times e^{j*Z1ANG}}{3 \cdot Z1MAG\_sec \times e^{j*Z1ANG}} \quad \text{Eq. 9}$$

The value k0 may be used to determine the impedance to the fault, which may be compared to the zone reach setting to determine if an event is in-zone or out-of-zone. If the configured line length is less than a minimum length (e.g., 3.73 mi or 6.0 km), zone 1 may be disabled. The zone 1 elements may be supervised with forward directional elements.

For zones 2 and 3, settings for distance elements (such as zone 2 reach (Z2set) or zone 3 reach (Z3set)) may be determined using Equation 10 and Equation 11, respectively.

$$Z2set = 1.2 * Z1MAG\_sec \quad \text{Eq. 10}$$

$$Z3set = 1.5 * Z1MAG\_sec \quad \text{Eq. 11}$$

The plurality of configuration settings may further include directional settings, according to some embodiments. Directional settings may be automatically determined based on the negative-sequence or zero-sequence impedance of the electrical power line. For a forward fault, negative-sequence or zero-sequence impedance seen by the IED may be negative in non-series compensated lines. Similarly, for a reverse fault, the negative-sequence or zero-sequence impedance seen by the IED may be positive in non-series compensated lines. The forward and reverse negative- or zero-sequence impedance settings for a directional element, according to one specific embodiment involving a 5 Amp nominal current protective IED, may be 0 and 0.1 secondary Ohms, respectively. Further, the negative or zero-sequence over-current supervision threshold may be set to 0.6 Amp and 0.4 Amp secondary for forward and reverse elements, respectively. Exemplary settings for a negative-sequence directional element of a 5 Amp nominal current protective IED may be:

Z2Fset=0.0,
Z2Rset=0.1,
50QFset=0.6, and
50QRset=0.4.

The above settings may be related to the forward directional zone 2 setting (Z2Fset), the reverse directional zone 2 setting (Z2Rset), the forward negative sequence overcurrent setting (50QFset) and the reverse negative sequence overcurrent setting (50QRset). The settings for a 5 Amp nominal current protective IED, as provided above, may be scaled for relays configured for a greater or lesser nominal current, according to some embodiments.

Figure 4:
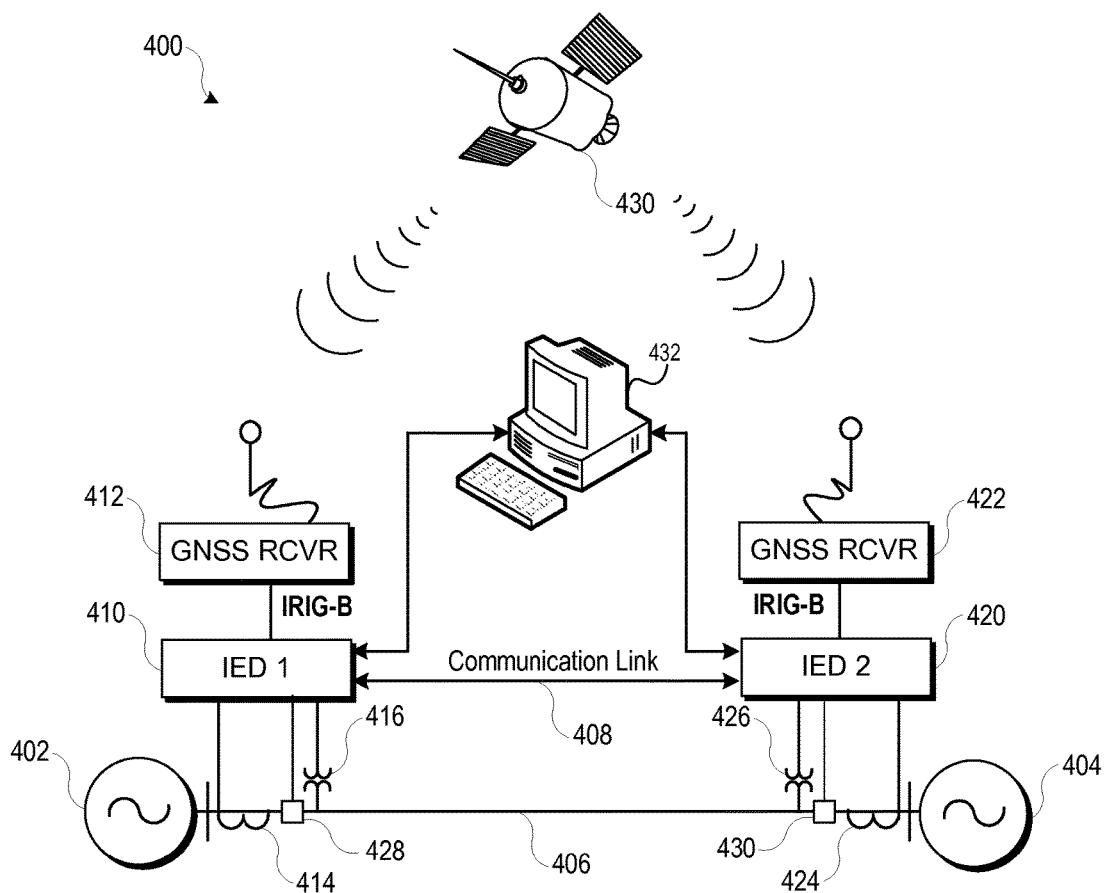
FIG. 4 illustrates a two-terminal electric power distribution system protected by a plurality of IEDs consistent with various embodiments of the present disclosure.

FIG. 4 illustrates a two-terminal electric power distribution system 400 that includes two generators 402 and 404 connected by an electrical power line 406. Although illustrated in single-line form for purposes of simplicity, system 400 may be a multi-phase system, such as a three-phase electric power delivery system. An electrical power line 406 is monitored and protected by two IEDs 410 and 420. Each of the IEDs 410 and 420 are in communication with a current transformer 414 and 424, respectively, and a potential transformer 416 and 426, respectively.

Each of IEDs 410 and 420 are in communication with a Global Navigational Satellite System (GNSS) receiver 412 and 422, respectively. GNSS receivers 412 and 422 may be configured to receive a time signal from a satellite 430. According to other embodiments, a variety of common time sources may be used in place of GNSS satellite 430. Some examples of a common time source include a WWVB or WWV system, a network-based system such as corresponding with IEEE 1588 precision time protocol, and/or the like. Other common time signal distribution configurations or protocols may be used such as IRIG, distribution over SONET, Ethernet, SDH, or the like. In one embodiment, the common time signal may be distributed using, for example, the ICON® communication network available from Schweitzer Engineering Laboratories, Inc. of Pullman, Wash., USA.

A data communication channel 408 may allow IEDs 410 and 420 to exchange information relating to, among other things, voltage and current measurements associated with electrical power line 406 and breaker status information. Breakers 428 and 430 may be disposed in communication with electrical power line 406, and may be controlled by IEDs 410 and 420, respectively. Data communication channel 408 may be embodied in a variety of media and may utilize a variety of communication protocols. For example, data communication channel 408 may be embodied utilizing physical media, such as coaxial cable, twisted pair, fiber optic, etc. Further, data communication channel 408 may utilize communication networks such as Ethernet, SONET, SDH, or the like, in order to communicate data. In further embodiments, data communication channel 408 may be a wireless communication channel (e.g., a radio communication channel) utilizing any suitable wireless communication protocol.

According to various embodiments consistent with the present disclosure, a system 400 may be configured using at least two techniques consistent with the present disclosure. First, IEDs 410 and 420 may be installed, and a configuration event may be intentionally created. One embodiment of this technique is described in detail in connection with FIG. 1A. As a result of the automatic configuration, IEDs 410 and 420 may be configured for protection of electrical power line 406.

Using a second technique, IEDs 410 and 420 may be set to default values or may be set by the user and may await the occurrence of a configuration event. The default values may be set in a conservative fashion. For example, the positive sequence impedance magnitude is may be set based on line length and line length units (e.g., 0.6 ohms/mi or 0.4 ohms/km). Zero sequence impedance may be set to three times the positive sequence impedance, although other suitable values are also contemplated. Line angles may be set based on a typical line angle (e.g., Z1ANG=85° or Z0ANG=80°). Further, according to some embodiments utilizing this technique, a user may be allowed to set the positive sequence and zero sequence impedance values. The zone reach settings may be defaulted to 60%, 120% and 150%, respectively, for zone 1, zone 2 and zone 3.

Upon the occurrence of a configuration event, such as a single pole open configuration, system 400 may acquire a plurality of electrical parameters during the configuration event that may be used to determine a plurality of configuration parameters. One embodiment of this technique is described in detail in connection with FIG. 1B. Following the configuration event, the default values may be replaced by a plurality of automatically determined configuration settings generated based upon the principles disclosed herein.

According to some embodiments, systems consistent with the present disclosure may be implemented using software operating on a variety of computing platforms, such as computer system 432. Software operating on computer system 432 may collect information from a plurality of IEDs in communication with an electric power delivery system. Further, computer system 432 may be configured to provide a report showing automatically determined relay settings and other related information.

Figure 5:
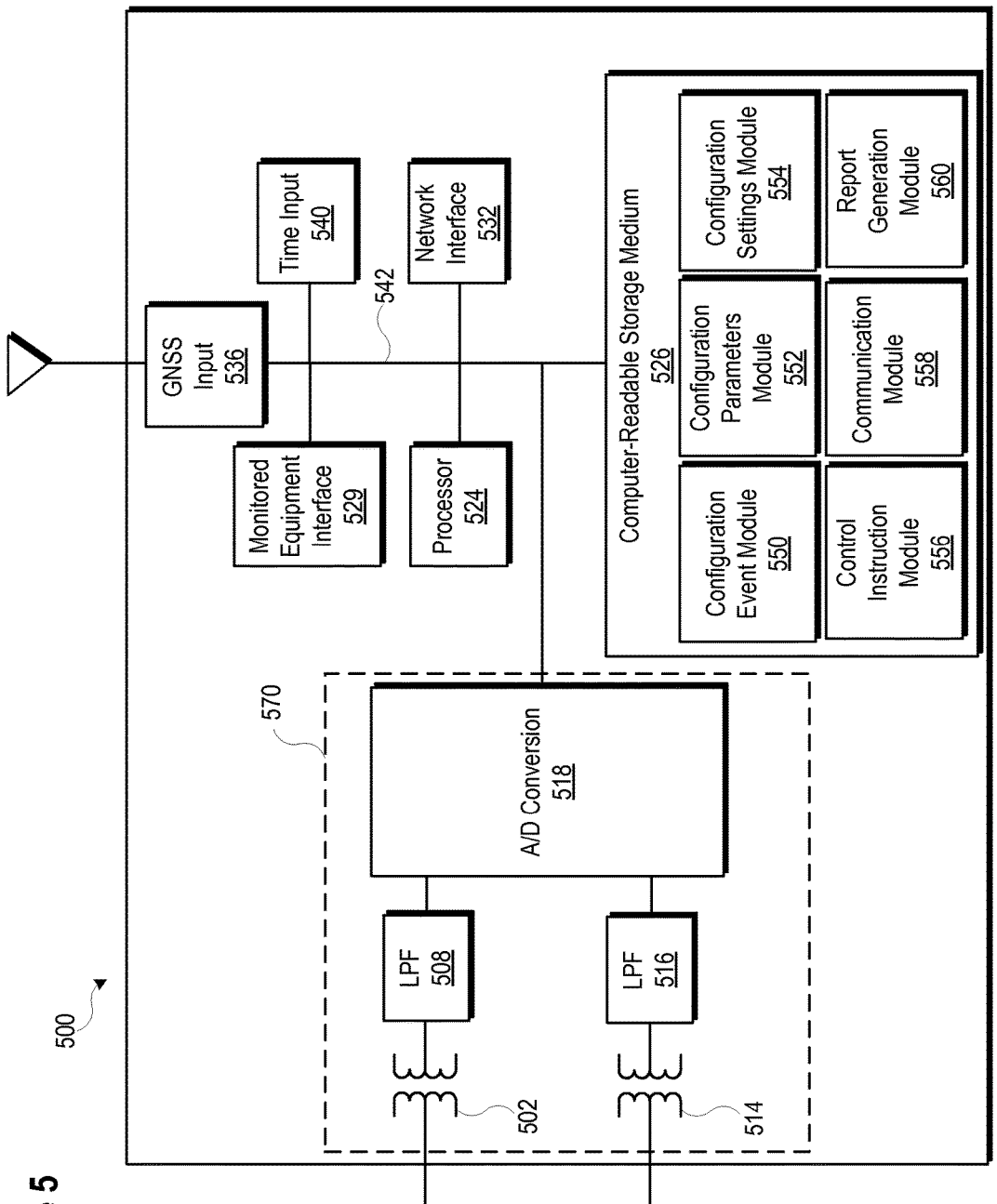
FIG. 5 illustrates a functional block diagram of an IED configured to automatically determine a plurality of configuration parameters based upon a configuration event consistent with various embodiments of the present disclosure.

FIG. 5 illustrates a simplified functional block diagram of an IED 500 consistent with various embodiments of the present disclosure that is configured to automatically determine a plurality of configuration parameters based upon a configuration event. IED 500 includes a network interface 532 configured to communicate with other IEDs and/or system devices. In certain embodiments, the communications interface 532 may facilitate direct communication with another IED or communicate with another IED over a communications network. Communications interface 532 may facilitate communications with multiple IEDs.

IED 500 may further include a time input 540, which may be used to receive a time signal (e.g., a common time reference) allowing IED 500 to apply a time-stamp to the acquired samples. In certain embodiments, a common time reference may be received via network interface 532, and accordingly, a separate time input may not be required for time-stamping and/or synchronization operations. One such embodiment may employ the IEEE 1588 protocol. Alternatively, a GNSS input 536 may be provided in addition to, or instead of, a time input 540.

A monitored equipment interface 529 may be configured to receive status information from, and issue control instructions to, a piece of monitored equipment (such as a circuit breaker, recloser, or the like). According to certain embodiments, the monitored equipment interface 529 may be configured to interface with a variety of equipment of an electric power delivery system. In certain embodiments, the equipment status information and control instructions may be communicated over the communications network interface 532.

Processor 524 may be configured to process communications received via network interface 532, time input 540, and/or monitored equipment interface 529. Processor 524 may operate using any number of processing rates and architectures. Processor 524 may be configured to perform various algorithms and calculations described herein. Processor 524 may be embodied as a general purpose integrated circuit, an application specific integrated circuit, a field-programmable gate array, and/or any other suitable programmable logic device.

In certain embodiments, IED 500 may include a sensor component 570. In the illustrated embodiment, sensor component 570 is configured to gather data from a conductor such as, for example, a power line (not shown) and may use, for example, transformers 502 and 514 and A/D conversion 518 that may sample and/or digitize filtered waveforms to form corresponding digitized current and voltage signals provided to data bus 542. In various embodiments, the sensor component 570 may include further signal processing such as low pass filters 508 and 516. A/D conversion 518 may be connected to processor 524 by way of data bus 542, through which digitized representations of current and voltage signals may be transmitted to processor 524. A/D conversion 518 may include a single A/D conversion or separate A/D conversions for each incoming signal. A current signal may include separate current signals from each phase of a three-phase electric power system. In various embodiments, the digitized current and voltage signals may be used to determine a plurality of configuration parameters as described herein.

In certain embodiments, a separate device may be used in place of the sensor component 570 for providing signals from the electric power delivery system to the IED 500. Indeed, a separate device may be configured to obtain signals from the electric power delivery system (such as voltage and/or current signals), and create digitized representations of the signals (for example current and voltage signals), apply a time stamp, and/or supply such information to IED 500. Further, the separate device may be configured to supply equipment status and/or measurements such as voltage and/or current magnitudes and/or angles along with time stamps to the IED 500. In certain embodiments, the information that has been described as being received from the sensor component 570 may instead be received from communications network interface 532.

The computer-readable storage medium 526 may be the repository of one or more modules and/or executable instructions configured to implement certain functions described herein. For example, computer-readable storage medium 526 may include configuration event module 550. Configuration event module 550 may be configured to identify a configuration event based upon specified conditions. According to some embodiments, the configuration event module 550 may be configured to determine the occurrence of a single pole open configuration. Upon the identification of a configuration event, configuration event module 550 may further be configured to obtain a plurality of electrical parameters associated with the configuration event. The electrical parameters may comprise a plurality of local measurements and/or a plurality of remote measurements of electrical conditions, such as voltage and current.

A configuration parameters module 552 may be configured to determine a plurality of configuration parameters based upon the plurality of electrical parameters. According to some embodiments, the configuration parameters may comprise a positive sequence line impedance value and a zero sequence line impedance value of an electrical power line.

A configuration settings module 554 may be configured to automatically determine a plurality of configuration settings based upon the plurality of configuration parameters. The configuration settings may, according to some embodiments, comprise one or more distance elements and one or more directional elements. The distance elements, according to some embodiments, may comprise a plurality of zone reach settings.

A control instruction module 556 may be configured to issue appropriate control instructions in order create a configuration event and/or to issue a command to remedy a single pole open configuration. As described above, a configuration event may be created according to certain embodiments, while in other embodiments, a configuration event may be unplanned. In either case, control instruction module 556 may generate commands appropriate for the situation.

A communications module 558 may be configured to allow IED 500 to communicate with any of a variety of external devices via network interface 532. Communications module 558 may be configured for communication using a variety of data communication protocols (e.g., IEEE C37.118, IEC 61850, etc.). A wide variety of types of data may be transmitted, including control instructions, measured electrical parameters, and the like.

Report generation module 560 may be configured to generate a variety of reports relating to, among other things, the plurality of configuration parameters and/or the plurality of configuration settings. Report generation module 560 may be automated, according to various embodiments, such that event reports associated with configuration events, configuration parameters, and/or configuration settings may be automatically generated. Further, report module 560 may operate in conjunction with communication module 558 in order to transmit such reports to appropriate personnel responsible for the operation of an affected electrical power delivery system.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A system for monitoring an electric power delivery system that includes a power line, comprising:
   a local intelligent electronic device (IED) in communication with a local portion of the power line obtaining local electric power system measurements and configured to monitor the local portion of the power line by determining a state of the local power line using predetermined configuration settings and electric power system measurements;
   a remote IED in communication with a remote portion of the power line obtaining remote electric power system measurements;
   a communication system in communication with the local and remote IEDs for transmitting the local and remote power system measurements;
   a configuration event module configured to receive the local and remote power system measurements, determine that the power line is loaded, and when it is determined that the power line is loaded, command a single pole to open to establish an unbalance condition on the electric power delivery system, issue a single-pole close command for the open pole;
   a configuration parameters module configured to receive the local and remote power system measurements and, when the power line is loaded, calculate, using the local and remote power system measurements obtained during the unbalance condition, a symmetrical component impedance of the power line from the local portion to the remote portion; and,
   a configuration settings module configured to calculate a plurality of protective element settings based on the calculated symmetrical component impedance of the power line, the protective element settings for use by the local IED to update the predetermined configuration settings for monitoring of the local portion of the power line.

2. The system of claim 1, wherein the local IED comprises the configuration event module, the configuration parameters module, and the configuration settings module.

3. The system of claim 1, wherein the configuration event comprises an unplanned event.

4. The system of claim 1, wherein the symmetrical component impedance of the power line comprises one selected from the group consisting of: positive sequence line impedance; zero sequence line impedance; and combinations thereof.

5. The system of claim 4, wherein the positive sequence line impedance is equal to:

$$\frac{V2x^2 - V2y^2}{I2x*V2y - I2y*V2x}$$

where:
V2x is a negative sequence voltage at a local terminal;
V2y is a negative sequence voltage at a remote terminal; and
I2x is a negative sequence current calculated at the local terminal; and
I2y is a negative sequence current calculated at the remote terminal.

6. The system of claim 4, wherein the zero sequence line impedance is equal to:

$$\frac{V0x^2 - V0y^2}{I0x*V0y - I0y*V0x}$$

where:
V0x is a zero sequence voltage calculated at the local terminal;
V0y is a zero sequence voltage calculated at the remote terminal; and
I0x is a zero sequence current calculated at the local terminal; and
I0y is a zero sequence current calculated at the remote terminal.

7. The system of claim 4, wherein the positive sequence line impedance or negative sequence line impedance are equal to:

$$\frac{(V2y - V2x)}{I2y}$$

where:
V2y is a negative sequence voltage calculated at the remote terminal;
V2x is a negative sequence voltage calculated at the local terminal; and,
I2y is a negative sequence current calculated at the remote terminal.

8. The system of claim 4, wherein the zero sequence line impedance is equal to:

$$\frac{(V0y - V0x)}{I0y}$$

where:
V0y is a zero sequence voltage calculated at the remote terminal;
V0x is a zero sequence voltage calculated at the local terminal; and
I0y is a zero sequence current calculated at the remote terminal.

9. The system of claim 1, wherein the plurality of protective element settings comprise settings for a distance element and a directional element.

10. The system of claim 1, wherein the protective element settings comprise a plurality of zone reach settings.

11. The system of claim 1, wherein the protective element settings comprise forward and reverse directional settings.

12. The system of claim 1, wherein the local IED is configured to apply the plurality of protective element settings.

13. The system of claim 1, wherein the local IED is configured to apply the plurality of protective element settings only after approval by a user.

14. A method for configuring an intelligent electronic device (IED) for protection of an electric power line of an electric power delivery system; comprising:
a local IED obtaining local electric power delivery system measurements from a local portion of the electric power line;
a remote IED obtaining remote electric power delivery system measurements from a remote portion of the electric power line;
commanding a single pole to open to establish an unbalance condition on the electric power delivery system when the electric power line is loaded;
commanding the single pole to close;
calculating, using the local and remote electric power delivery system measurements obtained during the unbalance condition when the electric power line is loaded, a symmetrical component impedance of the electric power line from the local portion to the remote portion; and,
calculating a plurality of IED protective element settings based on the calculated symmetrical component impedance of the electric power line.

15. The method of claim 14, wherein the local IED performs the steps of identifying the configuration event, calculating the symmetrical component impedance of the electric power line, and calculating the plurality of IED protective element settings.

16. The method of claim 14, wherein the power line symmetrical component impedances comprise one selected from the group consisting of: positive sequence line impedance; zero sequence line impedance; and combinations thereof.

17. An intelligent electronic device (IED) configured to monitor an electrical power line, the IED further configured to automatically determine a plurality of electric power system parameters during a configuration event, the IED comprising:
a data bus;
a communications port configured to transmit and receive information with a data network, the communications port in communication with the data bus;
a processor in communication with the data bus;
a non-transitory computer-readable storage medium in communication with the data bus and comprising instructions that when executed cause the processor to:
identify when the electrical power line is loaded;

when the power line is loaded, command a single pole to open to establish an unbalance condition on the electric power line;

command the single pole to close;

obtain a plurality of electrical parameters from a local portion of the electrical power line and a remote portion of the electrical power line associated with the unbalance condition;

calculate, using the plurality of electrical parameters obtained during the unbalance condition when the electrical power line is loaded, a symmetrical component impedance of the electric power line from the local portion to the remote portion;

automatically determine a plurality of protective element settings based upon the symmetrical component impedance of the electric power line; and configure the IED based on the plurality of protective element settings.

18. A system for monitoring an electric power delivery system that includes a power line, comprising:

a local intelligent electronic device (IED) in communication with a local portion of the power line obtaining local electronic power system measurements;

a remote IED in communication with a remote portion of the power line obtaining remote electric power system measurements;

a communication system in communication with the local and remote IEDs for transmitting the local and remote power system measurements;

a configuration event module configured to receive the local and remote power system measurements, determine that the power line is loaded, and when the power line is loaded, issue a single-pole open command to initiate an unbalance condition;

a configuration parameters module configured to detect an open pole condition, receive the local and remote power system measurements, issue a single-pole close command for the open pole condition, and, calculate a symmetrical component impedance of the power line from the local portion to the remote portion using the local and remote power system measurements obtained during the unbalance condition; and, a configuration settings module configured to calculate a plurality of protective element settings based on the symmetrical component impedance of the power line.

* * * * *